United States Patent [19]

Ryu et al.

[11] Patent Number: 4,977,564
[45] Date of Patent: Dec. 11, 1990

[54] CONTROLLER FOR SEMICONDUCTOR LASER LIGHT SOURCE

[75] Inventors: Shiro Ryu, Kanagawa; Kiyohumi Mochizuki, Hachioji, both of Japan

[73] Assignee: Kokusai Denshin Denwa Co., Ltd., Tokyo, Japan

[21] Appl. No.: 356,967

[22] Filed: May 25, 1989

[30] Foreign Application Priority Data

Jul. 1, 1988 [JP]    Japan .................................. 63-162451

[51] Int. Cl.$^5$ ............................................... H01S 3/13
[52] U.S. Cl. ........................................ 372/32; 372/38; 372/31; 372/97; 372/29
[58] Field of Search ................... 372/32, 29, 26, 75, 372/28

[56] References Cited

U.S. PATENT DOCUMENTS

| 4,479,221 | 10/1984 | Kitamura | 372/75 |
| 4,677,630 | 6/1987 | Fujita et al. | 372/32 |
| 4,748,632 | 5/1988 | Preston | 372/32 |

Primary Examiner—Leon Scott, Jr.
Attorney, Agent, or Firm—Jordan and Hamburg

[57] ABSTRACT

In a controller for a semiconductor laser light source, a portion of light emitted from the source is fed back to regulate the spectral line width of the source and to regulate the oscillation frequency of the source in terms of the phase of the portion or the driving current for the source, the very small portion of the light is allowed to pass through an external resonator so as to be subjected to optical frequency discrimination by an optical frequency discriminator, the portion does not need to be divided from a communication signal light. Therefore, the communication signal light can be undergo a loss.

4 Claims, 1 Drawing Sheet

CONTROLLER FOR SEMICONDUCTOR LASER LIGHT SOURCE

BACKGROUND OF THE INVENTION

The present invention relates to a controller for stabilizing the oscillation frequency of a semiconductor laser light source and improving the spectral linewidth thereof.

In heterodyne/coherent optical fiber communication, the difference between the oscillation frequency of a signal light source and that of a local oscillator light source needs to be kept stable because the frequency difference between them is detected and processed in an electric section as a beat signal. However, a semiconductor laser light source for such optical fiber communication is not good enough in the stability of the oscillation frequency of the light source and the spectral linewidth thereof. A procedure employing an external resonator has been so far used in order to stabilize the oscillation frequency and improve the spectral linewidth.

FIG. 2 shows a block diagram of a conventional semiconductor laser light source controller A including an external resonator 2, an optical divider 3, an optical frequency discriminator 4, a light receiver 5, and an automatic frequency control circuit 6. The external resonator 2 is for performing adjustment to alter an equivalent optical path length or phase for backward light L2 emitted backward from a semiconductor laser light source 1. Forward light L1 emitted foward from the light source 1 is divided into two lights L3 and L5 by the optical divider 3. The optical frequency discriminator 4 converts the change in the frequency or wavelength of the light L3 into that in the intensity of light L4. The light receiver 5 performs optoelectric conversion. The automatic frequency control circuit 6 regulates an injection current or the like for the semiconductor laser light source 1. The light L3 is subjected to optical frequency discrimination by the optical frequency discriminator 4 so that frequency-intensity converted light L4, the change in the intensity of which corresponds to that in the frequency of the light L3, is sent out from the discriminator 4. The light L5 is communication signal light, which is transmitted through a main line. Electric signals E1, E2, and E3 are generated by the light receiver 5 and auto-matic frequency control circuit 6. The change in the frequency of the light L3 sent out from the optical divider 3 is converted into that in the intensity of frequency-intensity converted light L4 by the optical frequency discriminator 4. The change in the intensity of frequency-intensity converted light L4 is converted into that in the intensity of the electric signal E1 by the light receiver 5.

Since the oscillation frequency of the semi-conductor laser light source 1 generally depends on the driving current for the light source, the electric signal E1 is supplied to the automatic frequency control circuit 6 in order to perform the feedback control of the driving current to stabilize the oscillation frequency. The length or phase of the external resonator 2 is altered in order to improve the spectral linewidth of the semiconductor laser light source 1. The oscillation frequency can be also stabilized by causing the electric signal E2 to alter the phase of return light L6 sent out from the external resonator 2 to the semiconductor laser light source 1. The external resonator 2 is made of a 100% reflection mirror, a diffraction grating or the like. Since the divided light L3 of the forward light L1 needs to be branched to the optical frequency discriminator 4, the forward light L1 undergoes a loss at a certain ratio to the communication signal light L5. For that reason, the conventional semiconductor laser light source controller has a problem that the interval between the repeaters in the main line is shortened. Therefore, it has been strongly desired to provide a device for performing the discrimination of the oscillation frequency of the semiconductor laser light source without causing the forward light to undergo the loss.

SUMMARY OF THE INVENTION

The present invention was made in order to solve the abovementioned problem.

Accordingly, it is an object of the present invention to provide a semiconductor laser light source controller by which the stabilization of the oscillation frequency of a semiconductor laser light source and the improvement of the spectral linewidth thereof can be performed without a loss in communication signal light. In the controller, a portion of light emitted from the light source is fed back to regulate the spectral linewidth of the light source and to regulate the oscillation frequency of the light source in terms of the phase of the portion or the driving current for the light source. The oscillator is characterized by comprising an external resonator provided at the backward end of the semiconductor laser light source so that a portion of the backward light, is allowed to pass through the resonator, the other portion of the backward light is reflected by the resonator, and the optical path for the reflected portion is altered; an optical frequency discriminator by which the change in the frequency of the portion having passed through the resonator is converted into that in the intensity of light; a light receiver which converts the intensity of the light into an electric signal; and an automatic frequency control circuit by which the feedback control of the injection current for the light source and/or the feedback control of the optical path of the resonator are performed on the basis of the change in the electric signal. Since the portion of the backward light is allowed to pass through the external resonator so as to be subjected to optical frequency discrmination by the optical frequency discriminator, the forward light does not need to be divided from the communication signal light. Therefore, the communication signal light does not undergo a loss. In other words, all the communication signal light can be effectively used. For that reason, the controller can be widely applied to stabilize the oscillation frequency of such a semiconductor laser light source and improve the spectral linewidth thereof in heterodyne/coherent optical fiber communication.

DETAILED DESCRIPTION OF EXEMPLARY EMBODIMENT

An embodiment of the present invention, which is a controller for a semiconductor laser light source, is hereafter described in detail with reference to FIG. 1.

Figure 1:
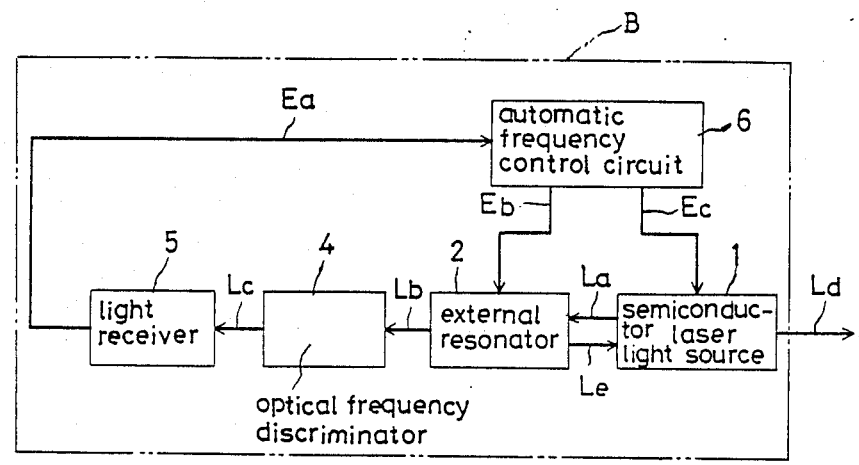
FIG. 1 shows a block diagram of a semi-conductor laser light source controller which is an embodiment of the present invention.
Figure 2:
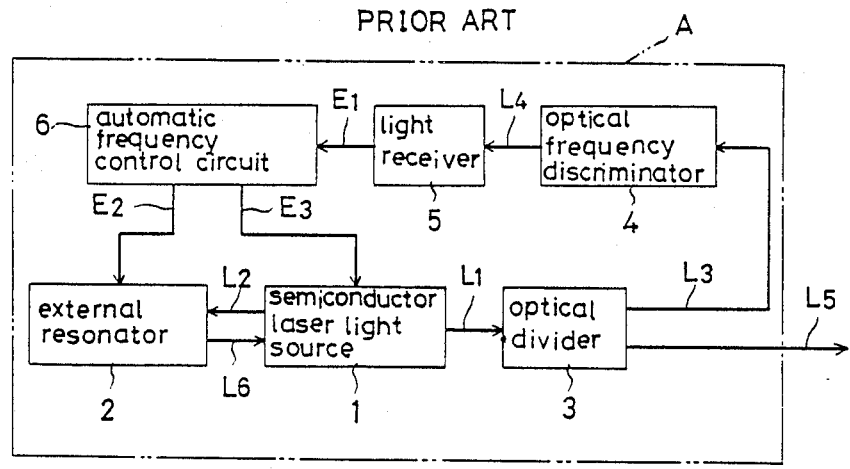
FIG. 2 shows a block diagram of a conventional semiconductor laser light source controller.

The mutually equivalent portions shown in FIGS. 1 and 2 are denoted by the same reference symbols therein.

FIG. 1 shows a block diagram of the controller B including an external resonator 2, an optical frequency discriminator 4, a light receiver 5 and an automatic frequency control circuit 6. Backward light La emitted backward from the semiconductor laser light source 1 is supplied to the external resonator 2. The resonator 2 is made of a half mirror through which a very small portion of the backward light La is allowed to pass, or the resonator 2 is made of a body having an optical waveguide, one of whose ends has a high reflection coating having a high reflectivity which is slightly lower than 100% or is about 90% to 99%, so that passing-through light Lb for optical frequency discrimination is supplied from the output end of the resonator 2 to the optical frequency discriminator 4. The passing-through light Lb is subjected to optical frequency discrimination by the discriminator 4 so that the change in the frequency of the light is converted into that in the intensity of frequency-intensity converted light Lc. The change in the intensity of frequency-intensity converted light Lc is converted into that in the intensity of an electric signal Ea by the light receiver 5. The automatic frequency control circuit 6 acts so that an injection current or the like for the semi-conductor laser light light source 1 is altered by an electric signal Ec sent out from the circuit 6, and the phase of return light Le sent out from the external resonator 2 to the semiconductor laser light source 1 is sequentially altered by an electric signal Eb sent out from the circuit, thus stabilizing the oscillation frequency of the light source. Forward signal light Ld for communication is transmitted through a main line.

If the optical frequency discriminator 4 is made of a body having an optical waveguide coated with high reflectivity on both of the ends of the waveguide and the external resonator 2 is made of a body having an optical waveguide coated with high reflectivity on one end of the waveguide, the discriminator 4 and the resonator 2 can be with the semiconductor laser light source 1, the light receiver 5 and the automatic frequency control circuit 6 all together to improve the reliability of the controller B and reduce the size thereof.

What is claimed is:

1. In a system including a semiconductor laser light source, means for feeding back a very small portion of light emitted from said source and reflecting it as a return light to said laser light source and means for feeding back a remainder passing-through portion to regulate a spectral linewidth of said laser light source and to regulate an oscillation frequency of said laser light source in terms of a phase of said return light or a driving injection current for said source, the improvement comprising a resonator provided externally of said laser light source at one of the ends of said laser light source so that onky a very small portion of said light emitted from said either end is allowed to pass through said resonator, the other portion thereof is reflected as said return light by said resonator directly to said laser light source, and the optical path length for said return light is altered;

an optical frequency discriminator for converting changes in the frequency of said portion that has passed through said resonator into changes in intensity of light; a light receiver for converting said changes in intensity to an electric signal;

and an automatic frequency control circuit for effecting feedback control of sadi injection current for said laser light source and feedback control of said phase and said optical pathlength of said return light reflected from said resonator in response to said intensity changes in said signal.

2. A system according to claim 1 wherein the external resonator is made of a half mirror through which light is allowed to pass very slightly.

3. A system according to claim 1, wherein at least the semiconductor laser light source, the external resonator and the optical frequency discriminator are integrated together.

4. A controller according to the claim 1 wherein said resonator is made of an optical waveguide having one end coated with high reflectivity through which light is allowed to pass very slightly.

* * * * *